(12) United States Patent
Chen et al.

(10) Patent No.: US 7,142,138 B2
(45) Date of Patent: Nov. 28, 2006

(54) MULTI-STEP ANALOG/DIGITAL CONVERTER AND ON-LINE CALIBRATION METHOD THEREOF

(75) Inventors: Chieh-Hung Chen, Hsinchu (TW); Yi-Chung Chen, Chutong Township, Hsinchu County (TW); Po-Chiun Huang, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 11/203,388

(22) Filed: Aug. 12, 2005

(65) Prior Publication Data

US 2006/0208933 A1    Sep. 21, 2006

(30) Foreign Application Priority Data

Mar. 16, 2005    (TW) .............................. 94107995 A (51) Int. Cl.
*H03M 1/10* (2006.01)
(52) U.S. Cl. ...................................... 341/120; 341/161
(58) Field of Classification Search ................ 341/155, 341/144, 161, 118, 120
See application file for complete search history.

(56) References Cited

U.S. PATENT DOCUMENTS

| | | | |
|---|---|---|---|
| 5,499,027 A | 3/1996 | Karanicolas et al. | |
| 5,534,864 A * | 7/1996 | Ono et al. | 341/156 |
| 6,437,717 B1 * | 8/2002 | Van der Ploeg et al. | 341/118 |
| 6,445,319 B1 * | 9/2002 | Bugeja | 341/138 |
| 6,529,149 B1 | 3/2003 | Karanicolas | |
| 6,563,445 B1 | 5/2003 | Sabouri | |
| 6,720,895 B1 | 4/2004 | Poulton et al. | |
| 6,784,814 B1 * | 8/2004 | Nair et al. | 341/118 |

* cited by examiner

*Primary Examiner*—Peguy JeanPierre
(74) *Attorney, Agent, or Firm*—Egbert Law Offices (57) ABSTRACT

The present invention discloses an on-line calibration method, which utilizes two calibration algorithms running in the background without interrupting the normal operation of the analog signal process. The method includes performing a residue amplifier gain error calibration and performing a DAC non-linearity calibration. The residue amplifier gain error calibration can reduce the gain error of the residue amplifier for a missing code or a missing decision level phenomenon. The DAC non-linearity calibration can relax the matching requirement of passive components in current semiconductor processes. The present invention discloses a two-step ADC (Analog-to-Digital Converter), which includes a first signal processing unit, a second signal processing unit, a programmable gain control unit and a programmable reference voltage generator, performing the on-line calibration method.

25 Claims, 9 Drawing Sheets

MULTI-STEP ANALOG/DIGITAL CONVERTER AND ON-LINE CALIBRATION METHOD THEREOF

RELATED U.S. APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

FIELD OF THE INVENTION

The present invention relates to an on-line calibration method, and more particularly to an on-line calibration method based on the combination of digital and analog philosophies, which is especially suitable for a multi-step ADC (Analog-to-Digital Converter). The present invention further relates to a multi-step ADC, and more particularly to a multi-step ADC, which utilizes the on-line calibration method as a calibration technique.

BACKGROUND OF THE INVENTION

In the last decade, due to the development of semiconductor processing technology, digital signal processing is getting more and more complex and computing capability is getting more and more powerful. More digital signal processing creates more stringent requirements on the interface to the real analog signal world. Currently, the performance index of analog-to-digital converter and digital-to-analog converter is pushing towards higher resolution, higher conversion rate, and most important of all, lower power dissipation that is suitable for embedded SOC applications.

Current semiconductor processing technology limits the resolution of most of the ADC to around 10–12 bits. In order to get high resolution ADC circuit design, trimming in passive components or calibration circuit techniques are general solutions. The trimming technique is not a good approach due to its high implementation cost. Therefore, the calibration techniques using circuit design techniques are more popular currently.

The first self-calibration ADC proposed by U.C. Berkeley researcher Hae-Seung Lee in 1984 is based on a successive approximation ADC. During calibration mode, the capacitor error is measured through a successive-approximation algorithm, and the error is saved to on-chip memory. During normal mode, the conversion output data will recall from on-chip memory, which contains capacitor error information, and these errors will be removed before data is sent out. In this approach, dedicated calibration mode is necessary, which means that analog input data cannot convert during calibration mode. In addition, successive approximation ADC has the disadvantage of low conversion speed, which cannot be used in video applications.

Since 1990, most researchers have focused on the calibration algorithm of high-speed A/D architecture, especially on pipelined ADC. In 1992, Seung-Hoon Lee at Illinois University proposed a digital calibration algorithm for pipelined ADC. Instead of analog calibration, the digital calibration algorithm measures the pipelined error in the digital domain and corrects the error in the digital domain. Currently, most offline calibrations use a similar technique to Lee's approach, measuring errors in the digital domain and correcting errors in the digital domain with some extra analog circuits and extra control timing.

The offline calibration described above needs an extra operation mode for calibration. However, in some data transmission applications, extra timing may not be possible. Since late 1990, researchers have developed a calibration algorithm that runs in the background so that the calibration will not interrupt the normal operations of the entire system. In 1997, Un-Ku Moon at Oregon University proposed a skip-and-fill algorithm to make background calibration possible. This algorithm uses similar calibration algorithms to the aforementioned. However, in order to make background calibration possible, the measurement cycles are spread over a long period of time. The algorithm skips a sample for every few samples, and the 'stolen' sample time is used for measuring the error of non-ideality. The skipped-sampled output will be generated by the post digital signal processing.

In 1998, Joseph Ingino at Stanford University proposed a continuously calibrated pipelined ADC. In this case, an extra-pipelined stage is introduced. When normal operations begin, this extra stage is performing calibration. Once the calibration of the extra stage is done, the first stage of the pipelined ADC and the extra stage will swap. After that, the calibrated extra stage is the same as the first stage of the pipelined ADC and the original first stage of pipelined ADC is performing calibrations. In 2003, Boris Murmann at U.C. Berkeley proposed a pipelined ADC without any feedback loop for calibrations. The entire calibration algorithm is completed based on the digital-post-processing unit, which can run in the background. In this architecture, the pseudo-random signal causes the ADC to be operated in two-mode. Both modes can obtain correct results. In normal cases without any non-linearity error, the residue output difference of the same input between two modes should be the same all the time. However, if non-linearity in the inter-stage circuit occurs, the digital post-processing will correct the error.

The previous background technique proposed by Boris Murmann needs quite complex digital signal processing like multiplications for all the converted samples.

Although calibration techniques have been proposed to correct the mismatch errors (e.g., see U.S. Pat. Nos. 5,499,027, 6,529,149, 6,563,445, 6,720,895), they need other overheads to achieve and suffer from a variety of disadvantages. They are generally time-consuming, difficult to implement, and require additional structures.

BRIEF SUMMARY OF THE INVENTION

The objective of the present invention is to provide a multi-step (for example, two-step) analog-to-digital converter and an on-line calibration method thereof. The on-line calibration method uses two background calibration algorithms which can run in the background without interrupting the normal operations of analog signal processing and thus mitigates both the phenomena of missing code or missing decision level, which are caused by the gain error of the residue amplifier, and the nonlinearity error of the sub-DAC (Digital-to-Analog Converter). Therefore, the matching requirement of passive components by the current semiconductor process and the precision requirement of the residue amplifier are reduced. Consequently, the power dissipation decreases.

The multi-step ADC of the present invention is based on a two-step ADC with conventional architecture, which does not change any normal analog signal processing. The on-line calibration method of the present invention is performed through the multi-step ADC by combining a first signal processing unit, a second signal processing unit, a programmable gain control unit and a programmable reference voltage generator.

In order to achieve the objective, the present invention discloses an on-line calibration method comprising the steps of: (1) performing a residue amplifier gain error calibration and (2) performing a DAC non-linearity calibration. The step of performing the residue amplifier gain error calibration gathers the residue plot information between coarse digital output and fine digital output, and obtains the real gain error value via statistical analysis and then fixes the real gain error by one of three modes. The step of performing the DAC non-linearity calibration, with the same approach, gathers the residue plot information between coarse digital output and fine digital output, and obtains the difference (i.e., the error) between the ideal value and the real output value via statistical analysis. The error is then reduced with only simple digital subtraction or accumulation, which requires very few digital circuits.

In order to perform the on-line calibration method, the present invention discloses a multi-step ADC, which is formed by adding four new blocks into a conventional multi-step ADC. These four new functional blocks are a first signal processing unit, a second signal processing unit, a programmable gain control unit and a programmable reference voltage generator. The first two functional blocks, which operate in the digital domain, are used to perform the residue amplifier gain calibration and to perform the DAC non-linearity calibration, respectively. The last two functional blocks, which operate in the analog domain, are used to determine the mode of adjustable gain control, and to generate an adjustable reference voltage, respectively. All the four added functional blocks are not involved in the process paths of analog signals, and therefore, the conversion rate will not be affected.

BRIEF DESCRIPTION OF THE SEVERAL VIEWS OF THE DRAWINGS

The invention will be described according to the appended drawings.

FIG. 5(*a*) and FIG. 5(*b*) show schematic views of illustrations of the residue plots of the residue signals with the gain error above one and below one, respectively.

DETAILED DESCRIPTION OF THE INVENTION

Figure 1:
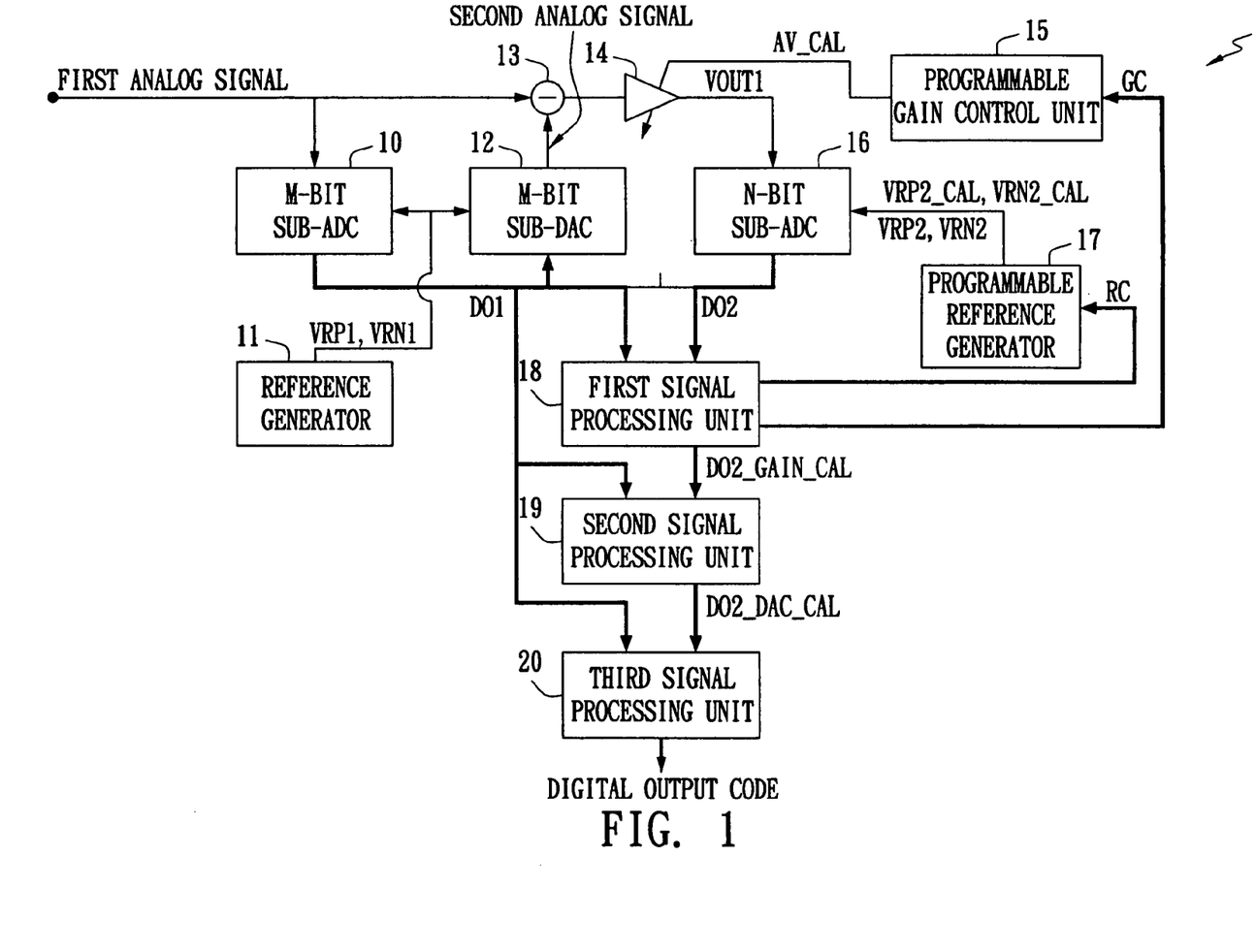
FIG. 1 is a schematic view of a block diagram of an embodiment of a multi-step ADC of the present invention.

In order to explain the on-line calibration method of the present invention more smoothly, the apparatus to perform the method is described first. FIG. 1 is a block diagram of an embodiment of a multi-step ADC 1 of the present invention. A two-step hardware architecture is used, hereinafter, as an example to explain the present invention. The two-step ADC 1 converts a first analog signal to a digital output code. The detailed description of FIG. 1 is as follows. Then, the ($2^5$–2) nonlinear calibration codes DO2_DAC_CAL are fed to the third signal processing unit 20.

An M-bit sub-ADC 10 receives and converts a first analog signal to an M-bit first digital code DO1. In general, the first digital code DO1 is called a coarse part. Then the first digital code DO1 is fed to an M-bit DAC 12 and converted to a second analog signal. An analog subtractor 13 is used to subtract the second analog signal from the first analog signal to generate an error signal. The error signal is then amplified through a residue amplifier 14 to generate a residue signal VOUT1. After that, an N-bit ADC 16 is used to convert VOUT1 to a second digital code DO2. In general, the second digital code DO2 is called a fine part. The least significant bit (LSB) of the first digital code DO1 and the most significant bit (MSB) of the corresponding second digital code DO2 overlap.

In order to perform the residue amplifier gain error calibration, it is necessary to deliver a plurality of first digital codes DO1 and the corresponding second digital codes DO2 to a first signal processing unit 18 that mainly performs the algorithm of the residue amplifier gain error calibration. Then the first signal processing unit 18 sends a reference control signal RC to a programmable reference voltage generator 17 or sends a gain control signal GC to a programmable gain control unit 15. The first signal processing unit 18 also provides a plurality of gain calibration codes DO2_GAIN_CAL to a second signal processing unit 19 for performing the DAC non-linearity calibration. The programmable gain control unit 15, which is an analog circuit, receives the gain control signal GC and sends an adjustable gain signal AV_CAL to the residue amplifier 14 and adjusts the gain thereof. The programmable reference voltage generator 17, which is also an analog circuit, receives the reference control signal RC and provides a first calibration reference voltage VRP2_CAL and a second calibration reference voltage VRN2_CAL to an N-bit sub-ADC 16 and then adjusts the voltage range of the second digital codes DO2. After receiving the first digital codes DO1 and the gain calibration codes DO2_GAIN_CAL, the second signal processing unit 19 performs the DAC non-linearity calibration. The result of performing the DAC non-linearity calibration is that a plurality of nonlinear calibration codes DO2_DAC_CAL, and the first digital codes DO1 are fed to a third signal processing unit 20. After that, the third signal processing unit 20 generates a plurality of digital output codes, which are with an (M+N–2) effective bit. A reference voltage generator 11 is used to provide a first fixed reference voltage VRP1 and a second fixed reference voltage VRN1 to determine the voltage range of the first digital codes DO1.

Figure 2:
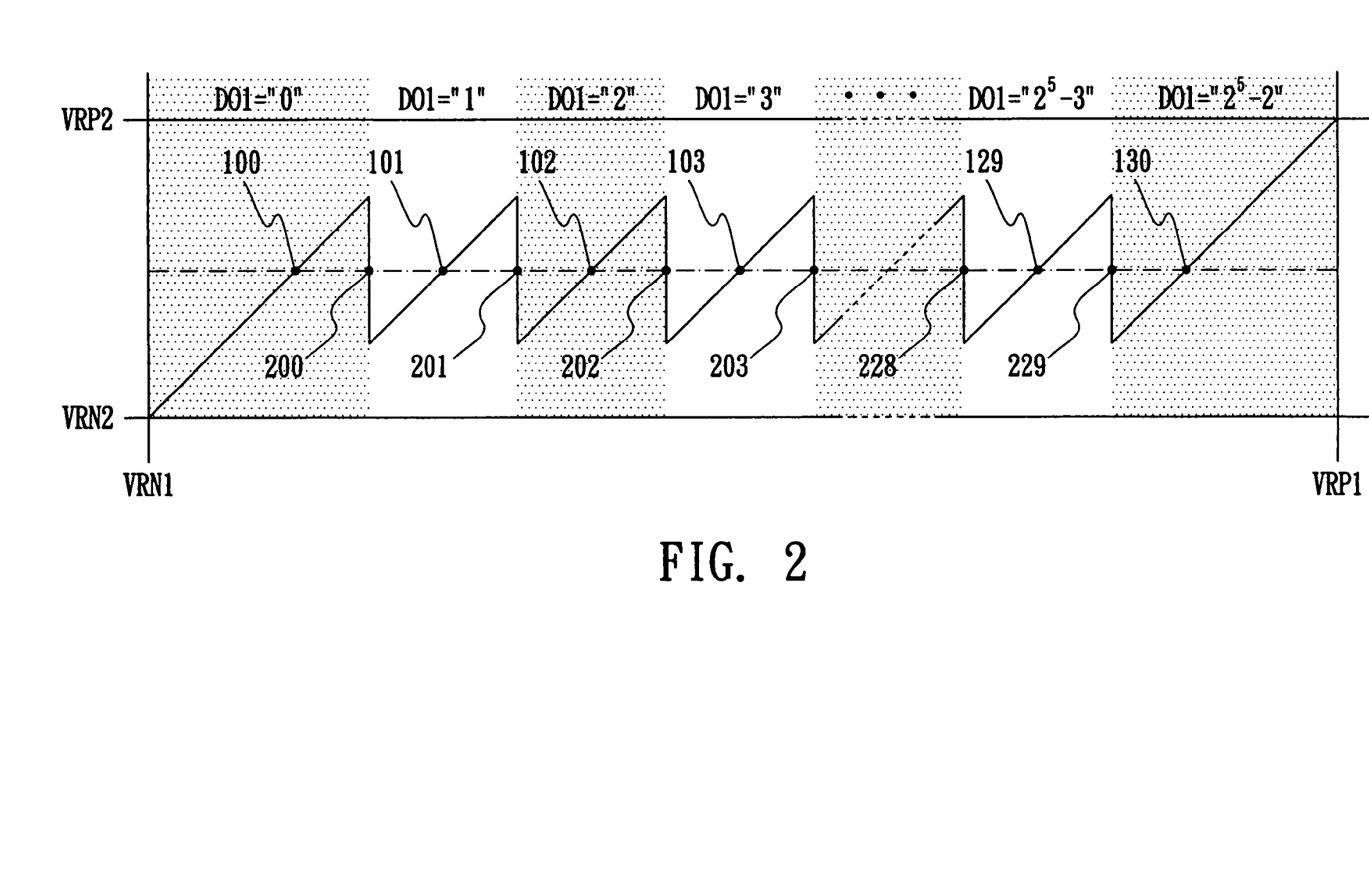
FIG. 2 is a schematic view of an illustration of a residue plot of the residue signal (M=5).

FIG. 2 is a residue plot of the residue signal VOUT1 with M=5, where the horizontal axis indicates the voltage range of the first digital codes DO1, which is defined by the first fixed reference voltage VRP1 and the second fixed reference voltage VRN1. The horizontal range is divided to ($2^5$–1) domains. Each domain is arranged and marked in order of the increment of the first digital codes DO1, i.e., from "0" to "$2^5-2$", in decimal format. The vertical axis indicates the voltage arrangement of the second digital codes DO2, which is defined by a first reference voltage VRP2, the current upper bound of the voltage range, and a second reference voltage VRN2, the current lower bound of the voltage range. The first reference voltage VRP2 and the second reference voltage VRN2 are generated by the programmable reference voltage generator 17. The nodes 200, 201 to 229 are representative of the comparator thresholds of the M-bit sub-ADC 10. In order to obtain a correct residue plot of the residue signal VOUT1, the second analog signal, which is the output level of the M-bit sub-DAC 12, should have a half-LSB shift. After the half-LSB shift, the positions of the second analog signal are shown as node 100, 101, 102 to 130.

Figure 3:
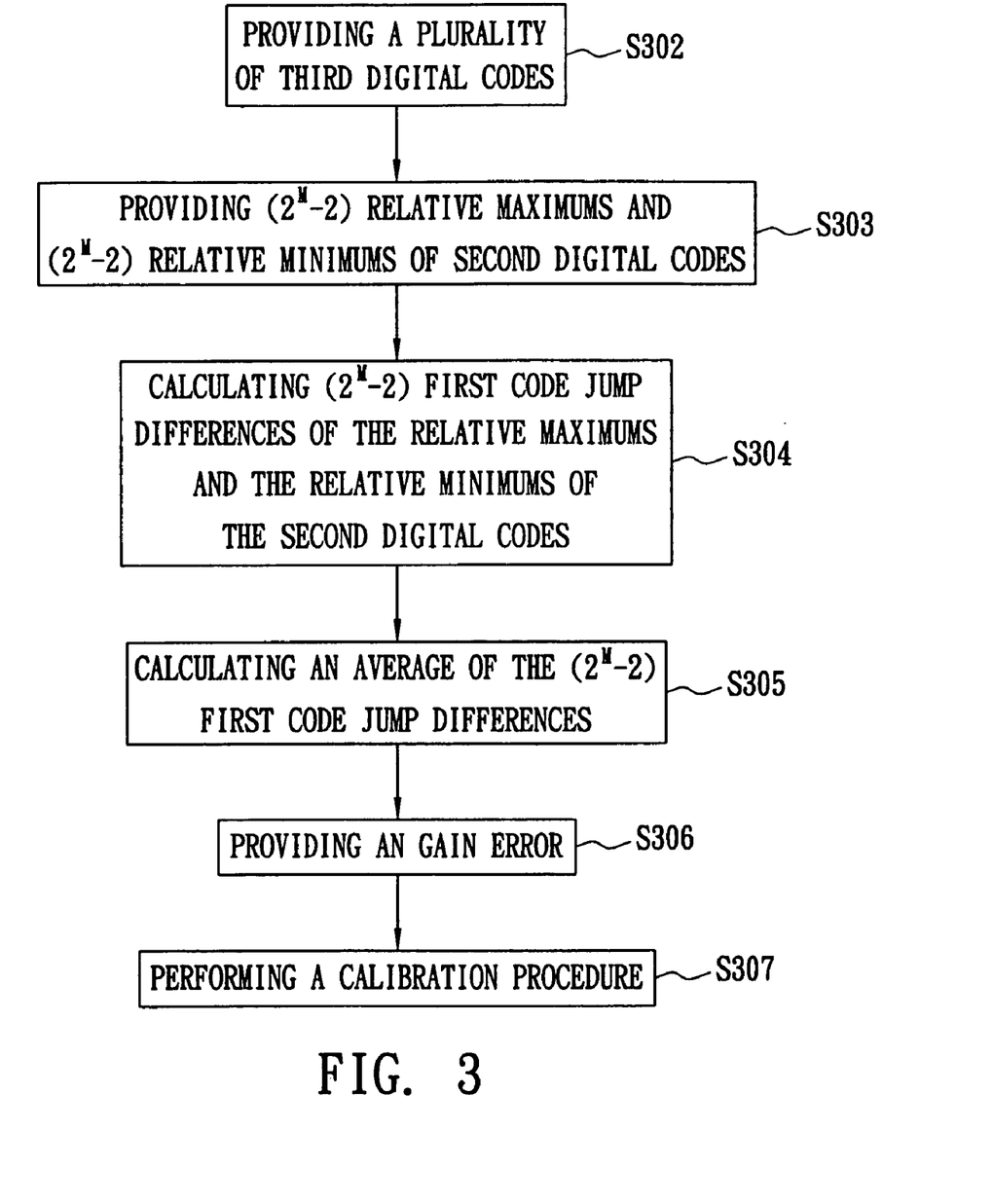
FIG. 3 is a flow chart of the residue amplifier gain error calibration of the present invention.

The following describes a flow chart of the residue amplifier gain error calibration as an embodiment with M=5 and N=7. FIG. 3 is a flow chart of the residue amplifier gain error calibration of the present invention. First, the step of S302 provides K third digital codes, where K is a positive integer. The K third digital codes are obtained by sampling an analog signal and converting K analog samples. Each third digital code contains a 5-bit first digital code DO1 and a 7-bit second digital code DO2, which are generated by a 5-bit sub-ADC 10 and a 7-bit sub-ADC 16, respectively. Then, the step of S303 provides ($2^5-1$) relative maximums and ($2^5-1$) relative minimums of the second digital codes DO2. At this step, a statistical approach is utilized to find a relative maximum and a relative minimum of the second digital codes DO2 that are corresponding to a certain first digital code DO1. The detailed algorithm (M=5) is explained as follows.

When DO1(I)="0", where I=0~(K-1), a relative maximum of the second digital codes DO2 is determined by choosing an absolute maximum of the second digital codes DO2 and is marked as U00; when DO1(I)="30", where I=0~(K-1), a relative minimum of the second digital codes DO2 is determined by choosing an absolute minimum of the second digital codes DO2 and marked as V30; when DO1(I)="1"~"29", where I=0~(K-1), a relative maximum and a relative minimum of the second digital codes DO2 are determined by choosing an absolute maximum and an absolute minimum of the second digital codes DO2, respectively, for each domain of DO1(I)="1"~"29". For example, for a first digital code DO1 belonging to the domain of DO1(I)="1"(i.e., the decimal value of the first digital code DO1(I) equals 1), a relative maximum and a relative minimum of the second digital codes DO2 with the corresponding first digital code (i.e., DO1(I)=1) are determined and marked as U01 and V01, respectively. Similarly, for a first digital code DO1 belonging to the domain of DO1(I)="2" (i.e., the decimal value of the first digital code DO1(I) equals 2), a relative maximum and a relative minimum of the second digital codes DO2 with the corresponding first digital code (i.e., DO1(I)=2) are determined and marked as U02 and V02, respectively. The algorithm continues until the domain of DO1="29". After the step of S303, thirty relative maximums (U00~U29) and thirty relative minimums (V01~V30) are obtained.

Then, the step of S304 calculates ($2^5-2$) first code jump differences of the relative maximums and the relative minimums of the second digital codes DO2. These thirty first code jump differences (W00~W29) are defined by formula set (1).

$$W00=U00-V01$$

$$W01=U01-V02$$

$$W02=U02-V03$$

$$W29=U29-V30 \quad (1)$$

Each first code jump difference between two adjacent domains is the difference between the relative maximum of the second digital codes DO2 in one domain and the relative minimum of the second digital codes DO2 in the following domain. After that, the step of S305 calculates an average W_AVG of the thirty first code jump differences, where W_AVG is the average of W00, W01, W02 to W29. Then, the step of S306 provides a gain error GAIN_ERR, where GAIN_ERR is defined by formula (2)

$$GAIN\_ERR=(W\_AVG+1-2^{N-1})/2^{N-1} \quad (2)$$

Figure 4:
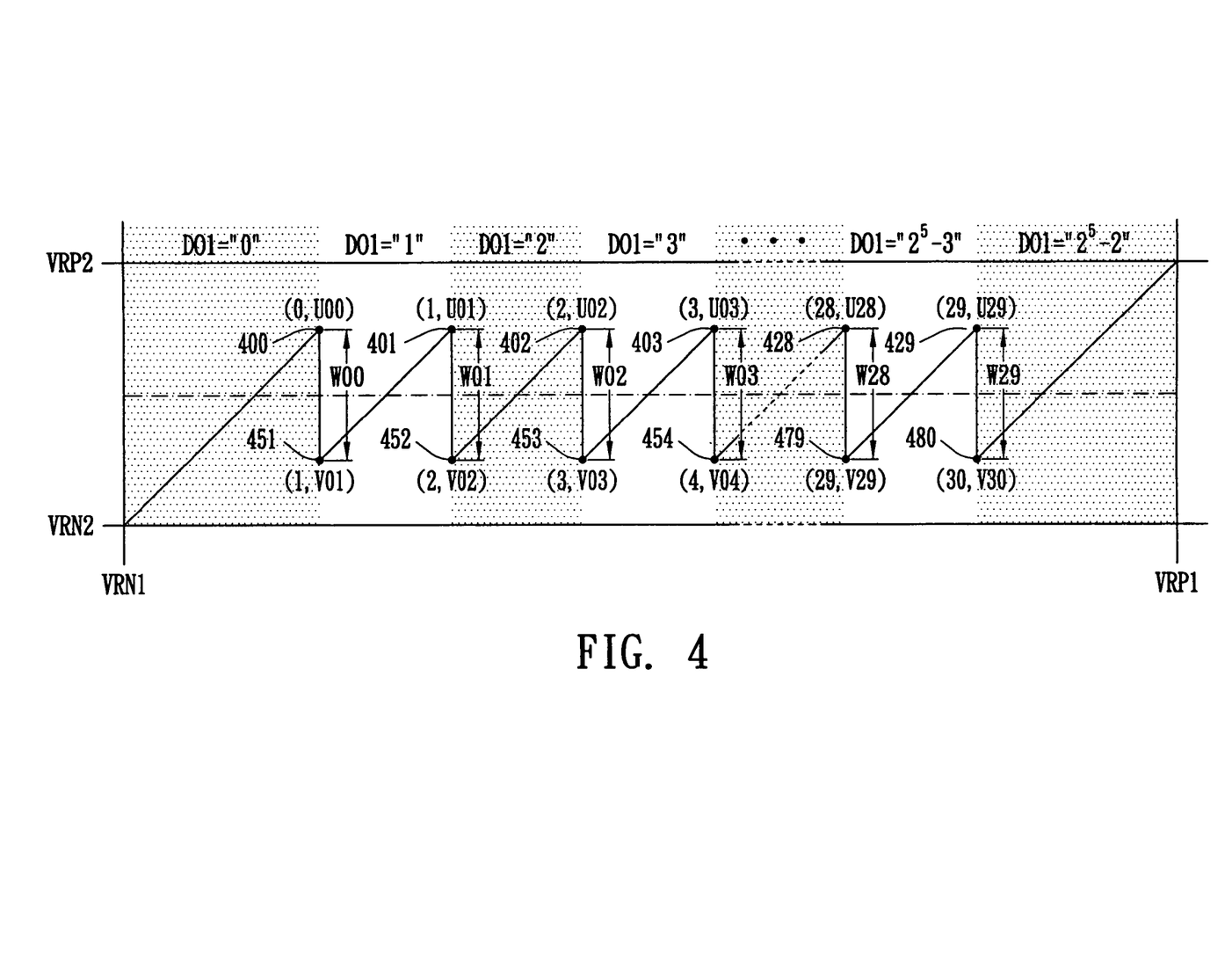
FIG. 4 is another schematic view of an illustration showing the relative maximums and the relative minimums of the second digital codes, and the first code jump differences in the residue plot of the residue signal.

In this embodiment of N=7, thus from formula (2) GAIN_ERR=(W_AVG+1-$2^{7-1}$)/$2^{7-1}$=(W_AVG-63)/64. If GAIN_ERR is zero, it means no gain error is generated and no calibration is required. If GAIN_ERR is not equal to zero, a calibration procedure is performed (refer to S307). The aforementioned relative maximums, relative minimums of the second digital codes DO2 and the first code jump differences are shown in FIG. 4, where the coordinates of the horizontal axis are presented in decimal form of the first digital code DO1 and those of the vertical axis are the voltage levels of the second digital code DO2.

There are three calibration procedures in the present invention: a digital gain calibration, an analog programmable gain calibration and an analog programmable reference voltage calibration. Only one of the three calibration procedures is required to achieve the purpose of the calibration.

In the digital gain calibration, K gain calibration codes are obtained by dividing each of K second digital codes DO2 from the 7-bit sub-ADC 16 by (1+GAIN_ERR). In the analog programmable gain calibration, the gain AV of the residue amplifier 14 and the gain error GAIN_ERR are used to generate an adjustable gain signal AV_CAL according to formula (3) (shown below). Then, the adjustable gain signal AV_CAL updates the gain AV of the residue amplifier 14.

$$AV\_CAL=AV/(1+GAIN\_ERR) \quad (3)$$

In the analog programmable reference voltage calibration, the gain error GAIN_ERR, the first reference voltage VRP2 and the second reference voltage VRN2 are used to generate, according to formula (4) and (5), the first calibration reference voltage VRP2_CAL and the second calibration reference voltage VRN2_CAL, which update a voltage range of the second digital codes DO2.

$$VRP2\_CAL=VRP2\times(1+GAIN\_ERR) \quad (4)$$

$$VRN2\_CAL=VRN2\times(1+GAIN\_ERR) \quad (5)$$

The first calibration reference voltage VRP2_CAL, the second calibration reference voltage VRN2_CAL and the average W_AVG of the first code jump differences satisfy formula (6).

$$W\_AVG=(VRP2\_CAL-VRN2\_CAL)/2 \quad (6)$$

The advantage of the digital gain calibration is that all the sampled data is still available after running this calibration. If the analog programmable gain calibration or the analog programmable reference voltage calibration is used, the first K digital output codes will not be calibrated.

Figure 5A:
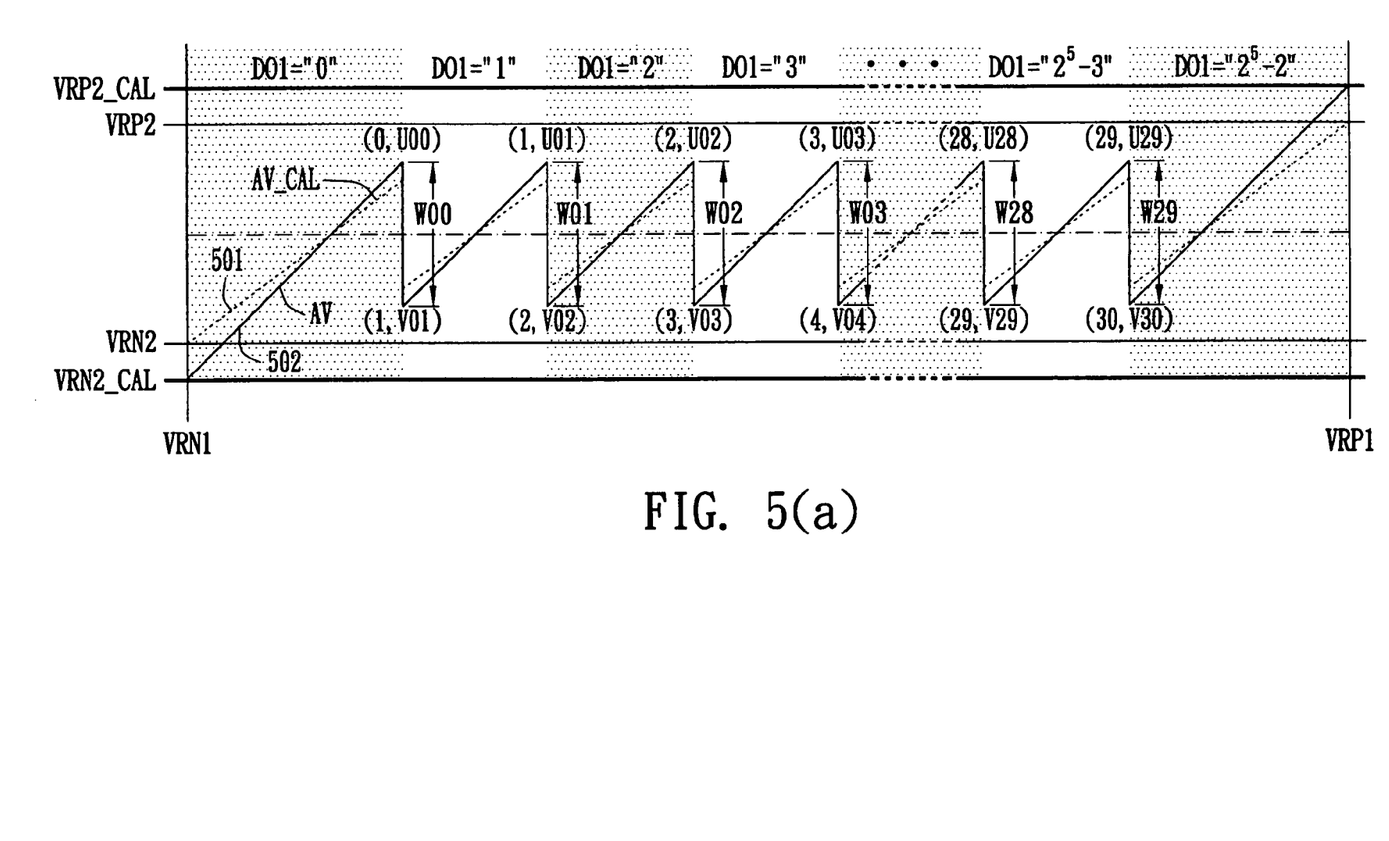
Figure 5B:
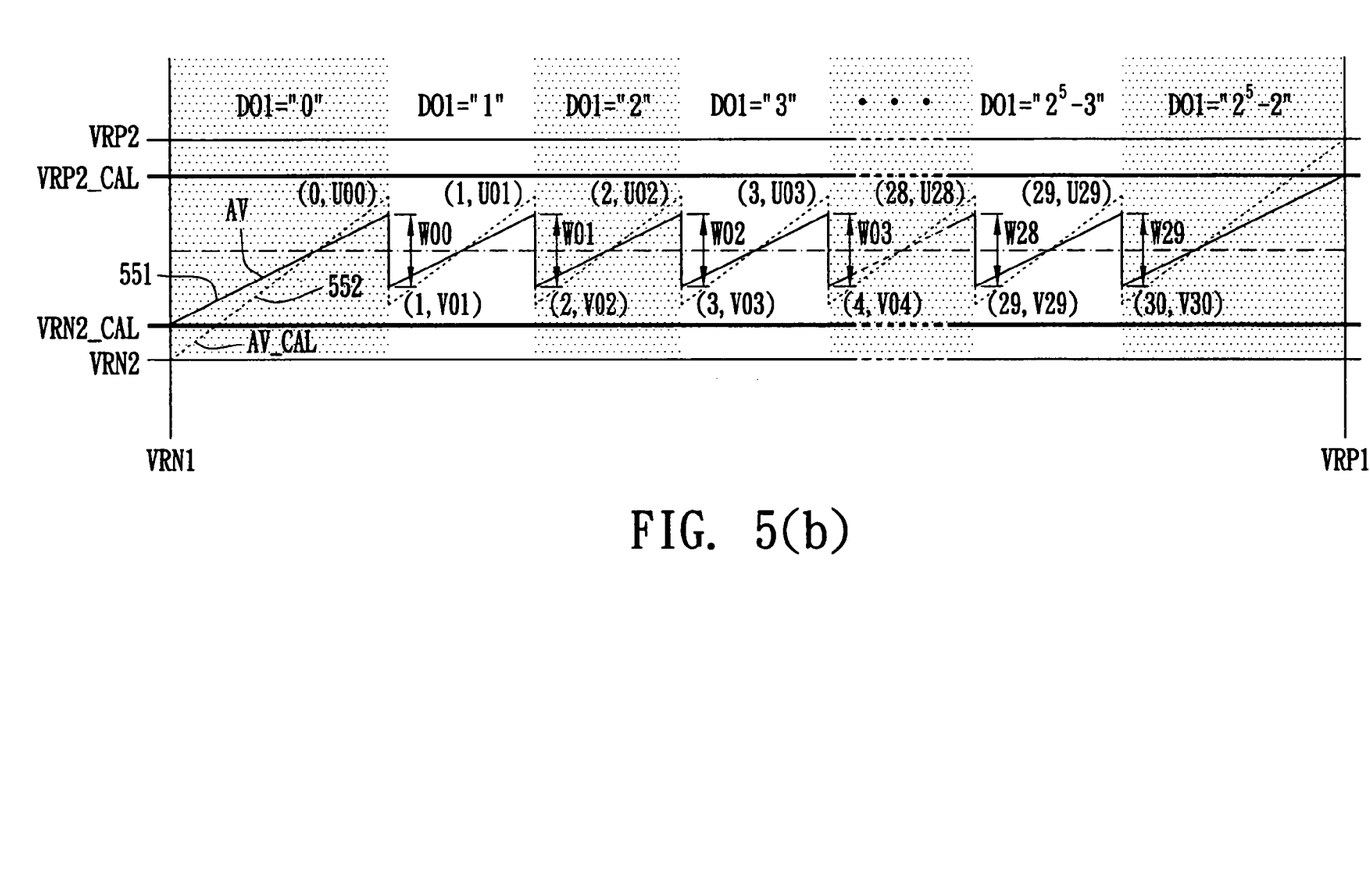

FIG. 5(a) and FIG. 5(b) show the residue plots of the residue signals with the gain error GAIN_ERR above one and below one, respectively. In FIG. 5(a), the solid line 502 indicates the real transfer curve of the residue plot. "AV" on the solid line 502 means the solid line 502 is obtained according to the gain AV of the residue amplifier 14. The vertical coordinate of the initial point of the solid line 502 is VRN2_CAL, which means the solid line 502 is obtained according to the analog programmable reference voltage calibration. The dashed line 501 indicates the ideal transfer curve (called the calibrated transfer curve). "AV_CAL" on the dashed line 501 means the dashed line 501 is obtained according to the analog programmable gain calibration. Similarly, the solid line 551 (real transfer curve) in FIG. 5(b) is obtained according to the analog programmable reference voltage calibration and the dashed line 552 (ideal transfer curve) is obtained according to the analog programmable gain calibration.

Figure 6:
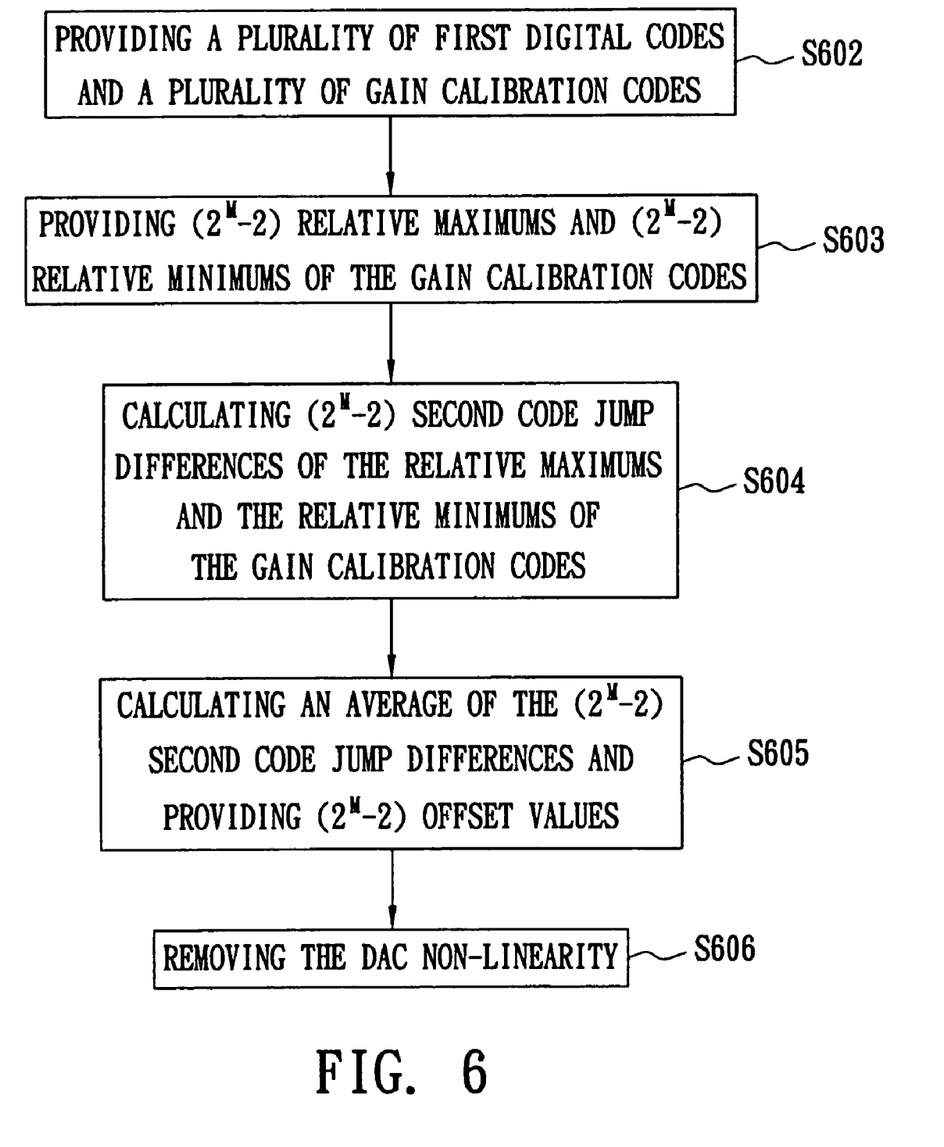
FIG. 6 is a flow chart of the DAC non-linearity calibration.

FIG. 6 is a flow chart of the DAC non-linearity calibration. First, the step of S602 provides K first digital codes DO1 and K gain calibration codes DO2_GAIN_CAL by sampling an analog signal. Then, the step of S603 provides ($2^5$–2) relative maximums and ($2^5$–2) relative minimums of the gain calibration codes DO2_GAIN_CAL. At this step, a statistical approach is utilized to find a relative maximum and a relative minimum of the gain calibration codes DO2_GAIN_CAL that are corresponding to a certain first digital code DO1. The detailed algorithm (M=5) is explained as follows.

When DO1(I)="0", where I=0~(K–1), a relative maximum of the gain calibration codes DO2_GAIN_CAL is determined by choosing an absolute maximum of the gain calibration codes DO2_GAIN_CAL and is marked as R00; when DO1(I)="30", where I=0~(K–1), a relative minimum of the gain calibration codes DO2_GAIN_CAL is determined by choosing an absolute minimum of the gain calibration codes DO2_GAIN_CAL and marked as S30; when DO1(I)="1"~"29", where I=0~(K–1), a relative maximum and a relative minimum of the gain calibration codes DO2_GAIN_CAL are determined by choosing an absolute maximum and an absolute minimum of the gain calibration codes DO2_GAIN_CAL, respectively, for each domain of DO1(I)="1"~"29". For example, for a first digital code DO1 belonging to the domain of DO1(I)="1"(i.e., the decimal value of the first digital code DO1(I) equals 1), a relative maximum and a relative minimum of the gain calibration codes DO2_GAIN_CAL with the corresponding first digital code (i.e., DO1(I)=1) are determined and marked as R01 and S01, respectively. Similarly, for a first digital code DO1 belonging to the domain of DO1(I)="2" (i.e., the decimal value of the first digital code DO1(I) equals 2), a relative maximum and a relative minimum of the gain calibration codes DO2_GAIN_CAL with the corresponding first digital code (i.e., DO1(I)=2) are determined and marked as R02 and S02, respectively. The algorithm continues until the domain of DO1="29". After the step of S603, thirty relative maximums (R00~R29) and thirty relative minimums (S01~S30) are obtained.

After that, the step of S604 calculates ($2^5$–2) second code jump differences (T00~T29) of the relative maximums and the relative minimums of the gin calibration codes DO2_GAIN_CAL. These thirty second code jump differences (T00~T29) are defined by formula set (7).

$T00 = R00 - S01$ $T01 = R01 - S02$ $T02 = R02 - S03$ $T29 = R29 - S30$ (7)

Each second code jump difference between two adjacent domains is the difference between the relative maximum of the gain calibration codes DO2_GAIN_CAL in one domain and the relative minimum of the gain calibration codes DO2_GAIN_CAL in the following domain.

Figure 7:
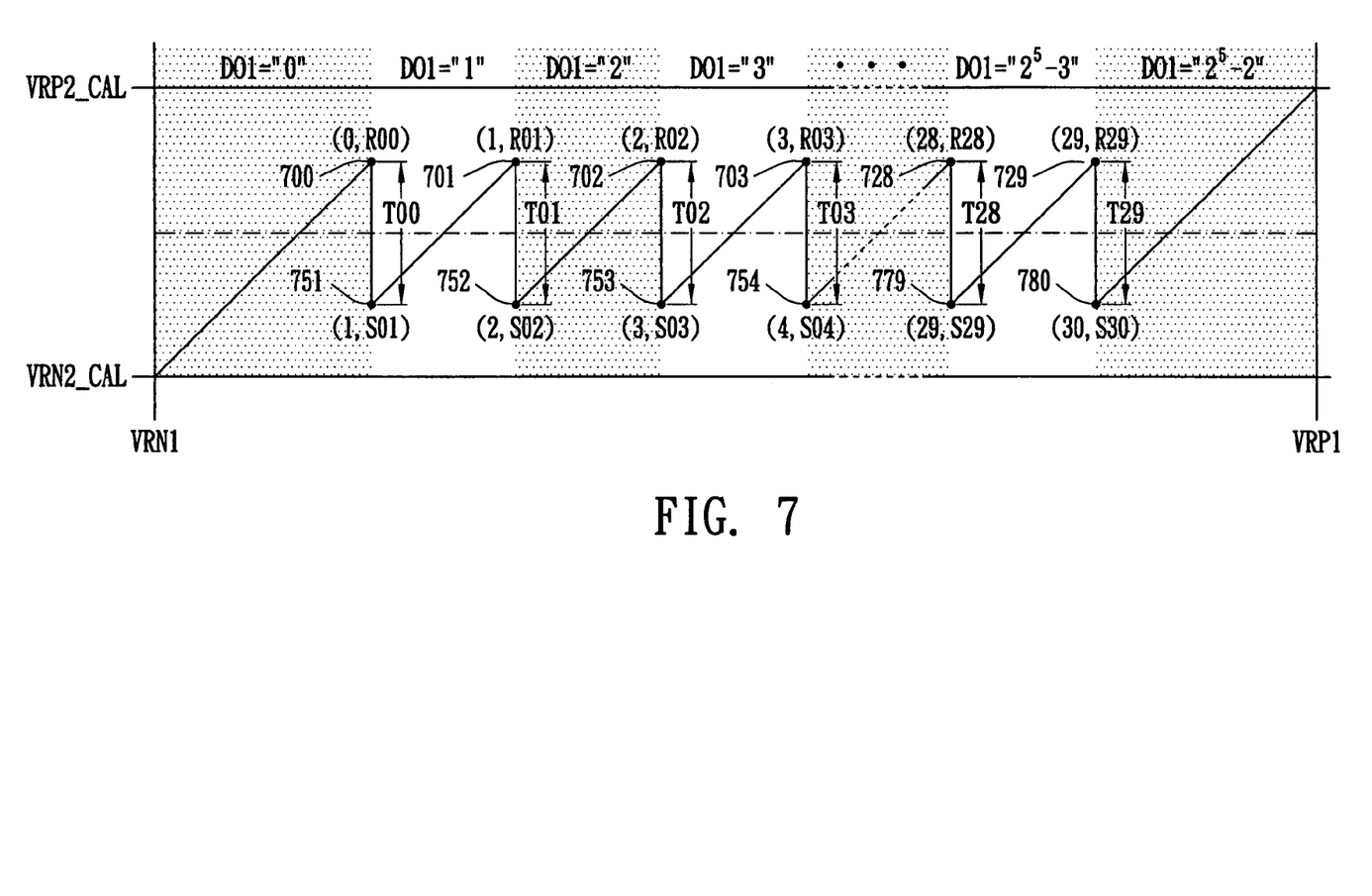
FIG. 7 shows another schematic view of an illustration of the relative maximums and the relative minimums of the gain calibration codes, and the second code jump differences in the residue plot of the residue signal.

The aforementioned relative maximums (R00~R29), relative minimums (S01~S30) of the gain calibration codes DO2_GAIN_CAL and the second code jump differences (T00~T29) are shown in FIG. 7, where the coordinates of the horizontal axis are presented in decimal form of the first digital code DO1 and those of the vertical axis are the voltage levels that are bounded by the first calibration reference voltage VRP2_CAL and the second calibration reference voltage VRN2_CAL.

The step of S605 calculates an average T_AVG of the ($2^5$–2) second code jump differences (T00~T29), and calculates ($2^5$–2) offset values. The thirty offset values (DEL_T00~DEL_T29) are obtained by formula set (8).

$DEL\_T00 = T00 - T\_AVG$ $DEL\_T01 = T01 - T\_AVG$ $DEL\_T02 = T02 - T\_AVG$ $DEL\_T29 = T29 - T\_AVG$ (8)

Then, the step of S606 removes the DAC non-linearity, which utilizes the ($2^5$–2) offset values and the K gain calibration codes DO2_GAIN_CAL to generate ($2^5$–2) non-linear calibration codes DO2_DAC_CAL. The ($2^5$–2) non-linear calibration codes DO2_DAC_CAL are defined by formula set (9).

If DO1="0", then
   DO2_DAC_CAL=DO2_GAIN_CAL;

If *DO*1="1", then
   *DO*2_DAC_CAL=*DO*2_GAIN_CAL+DEL_
   *T*00;

If *DO*1="2", *DO*2_DAC_CAL=*DO*2_GAIN_CAL+
   DEL_*T*00+DEL_*T*01;

If *DO*1="3", *DO*2_DAC_CAL=*DO*2_GAIN_CAL+
   DEL_*T*00+DEL_*T*02;

If *DO*1="29", DO2_DAC_CAL=DO2_GAIN_CAL+
   DEL_*T*00+DEL_*T*02+ . . . +DEL_T28;

If *DO*1="30", *DO*2_DAC_*CAL=DO*2_GAIN_CAL+
   DEL_*T*00+DEL_*T*01+DEL_*T*02+ . . .
   +DEL_*T*28+DEL_*T*29. (9)

Then, the ($2^5$–2) nonlinear calibration codes DO2_DAC_CAL are fed to the third signal processing unit 20.

Figure 8:
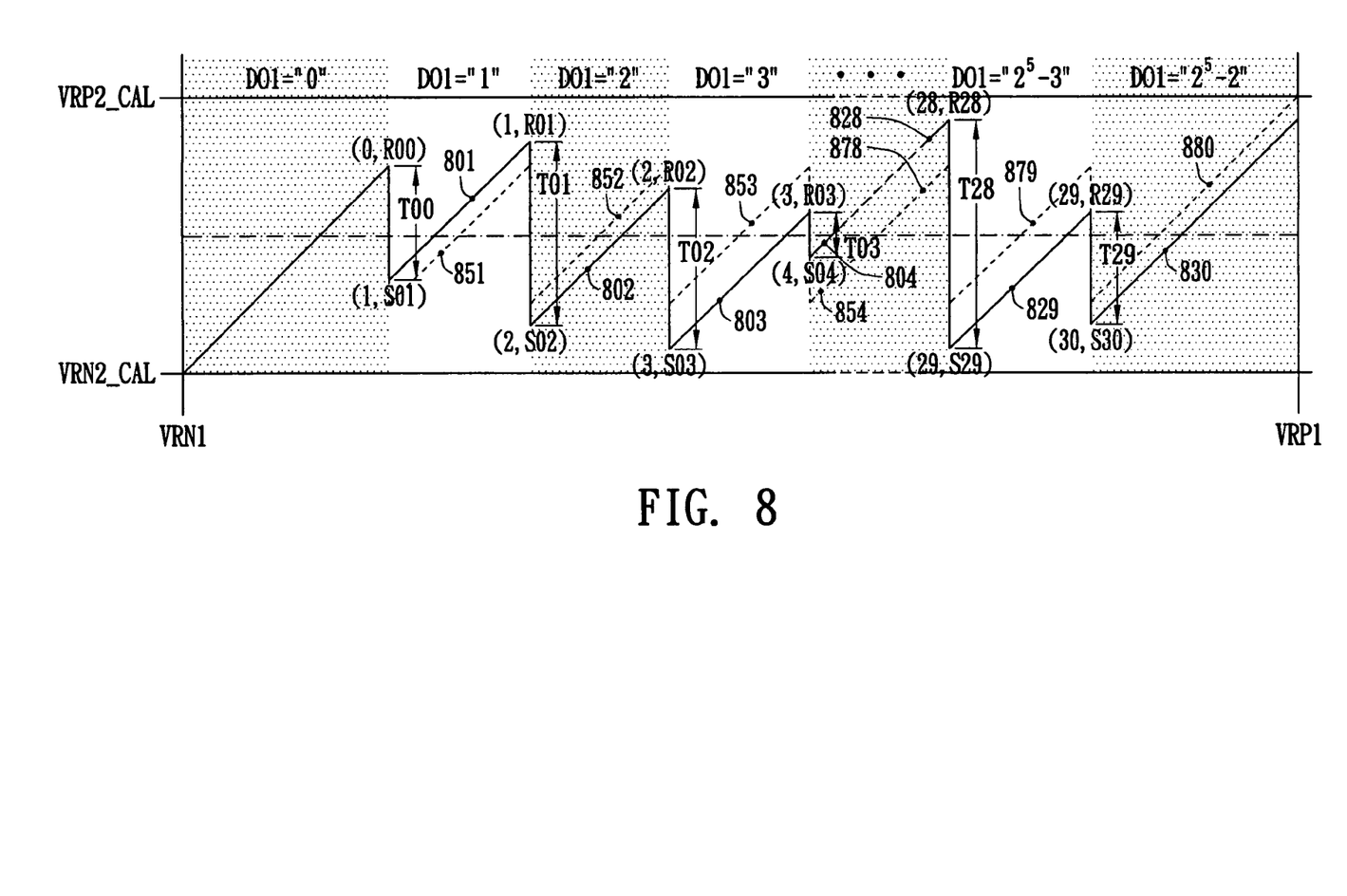
FIG. 8 is a schematic view of an illustration of a residue plot of the residue signal with DAC non-linearity (M=5).

FIG. 8 is a residue plot of the residue signal VOUT1 with DAC non-linearity (M=5). In FIG. 8, the real transfer curve is indicated by the solid lines 801, 802 to 830. The ideal transfer curve is indicated by the dashed lines 851, 852 to 880. FIG. 8 shows that the issue of the DAC non-linearity is solved by shifting the residue voltage transfer curve from the positions of the solid lines to those of the dashed lines. That is, when DO1="1", the residue voltage transfer curve is shifted from the solid line 801 to the dashed line 851; when DO1="2", the residue voltage transfer curve is shifted from the solid line 802 to the dashed line 852; when DO1="3", the residue voltage transfer curve is shifted from the solid line 803 to the dashed line 853, and so on.

The above-described embodiments of the present invention are intended to be illustrative only. Numerous alternative embodiments may be devised by persons skilled in the art without departing from the scope of the following claims.

We claim:

1. An on-line calibration method of a multi-step analog/digital converter (ADC), wherein said multi-step ADC is comprised of a first ADC, a second ADC, a digital/analog converter (DAC) and a residue amplifier, the on-line calibration method comprising the steps of:
performing a gain error calibration for the residue amplifier, the step of performing the gain error calibration for the residue amplifier comprises the steps of:
sampling an analog signal to generate a plurality of first digital codes and a plurality of second digital codes, wherein the second digital codes are based on a comparison of the analog signal with a residue signal of the first digital codes;
calculating a gain error based on a plurality of relative maximums and a plurality of relative minimums of the second digital codes; and
performing a calibration procedure based on the gain error; and performing a non-linearity calibration for the DAC.

2. The on-line calibration method of a multi-step ADC of claim 1, wherein calculating the gain error comprises the steps of:
calculating a plurality of first code jump differences of the relative maximums and the relative minimums;
calculating an average of the first code jump differences; and
calculating the gain error based on the average.

3. The on-line calibration method of a multi-step ADC of claim 2, wherein calculating the gain error is defined by the following equation:

$$\text{GAIN\_ERR} = (W\_\text{AVG} + 1 - 2^{N-1})/2^{N-1},$$

where GAIN_ERR is the gain error W_AVG is the average of the first code jump differences, and N is the bit number of the second digital codes.

4. The on-line calibration method of a multi-step ADC of claim 2, wherein each first code jump difference between two adjacent domains is the difference between the relative maximum of the second digital codes in one domain and the relative minimum of the second digital codes in the other domain.

5. The on-line calibration method of a multi-step ADC of claim 1, wherein if the bit numbers of the first digital codes and the second digital codes are M and N, respectively, the numbers of the relative maximums and the relative minimums of the second digital codes are both $2^M - 2$.

6. The on-line calibration method of a multi-step ADC of claim 1, further comprising:
obtaining the relative maximums and the relative minimums of the second digital codes, comprising the steps of:
providing a plurality of domains in order of the increment of the first digital codes;
choosing an absolute maximum and an absolute minimum of the second digital codes as the relative maximum and the relative minimum in the first domain and the last domain, respectively; and
choosing an absolute maximum and an absolute minimum of the second digital codes as the relative maximum and the relative minimum in each of the other domains.

7. The on-line calibration method of a multi-step ADC of claim 1, being selected from the group consisting of a digital gain calibration, an analog programmable gain calibration and an analog programmable reference voltage calibration.

8. The on-line calibration method of a multi-step ADC of claim 1, further comprising the step of:
calculating a plurality of gain calibration codes, wherein each gain calibration code is defined as the corresponding second digital code divided by (1+GAIN_ERR), where GAIN_ERR is the gain error.

9. The on-line calibration method of a multi-step ADC of claim 1, further comprising the step of:
calculating an adjustable gain signal to update a gain of the residue amplifier, where the adjustable gain signal is defined by the following equation:

$$\text{AV\_CAL} = \text{AV}/(1+\text{GAIN\_ERR}),$$

where AV_CAL is the adjustable gain signal, AV is the gain of the residue amplifier, and GAIN_ERR is the gain error.

10. The on-line calibration method of a multi-step ADC of claim 1, further comprising the step of:
generating a first calibration reference voltage and a second calibration reference voltage to update the voltage range of the second digital codes, and the first calibration reference voltage and the second calibration reference voltage are defined by the following equations:

$$\text{V}RP2\_\text{CAL} = \text{V}RP2 \times (1+\text{GAIN\_ERR}), \text{ and}$$

$$\text{V}RN2\_\text{CAL} = \text{V}RN2 \times (1+\text{GAIN\_ERR}),$$

where VRP2 and VRN2 are the current upper bound and lower bound of the voltage range of the second digital codes, respectively, and VRP2_CAL and VRN2_CAL are the first calibration reference voltage and the second calibration reference voltage, respectively, and GAIN_ERR is the gain error.

11. The on-line calibration method of a multi-step ADC of claim 10, wherein the difference between the first calibration reference voltage and the second calibration reference voltage is twice the average of the first code jump differences.

12. The on-line calibration method of a multi-step ADC of claim 10, wherein performing the non-linearity calibration for the DAC comprises the steps of:
sampling an analog signal to generate a plurality of first digital codes and a plurality of second digital codes;
generating a plurality of gain calibration codes based on the second digital codes, wherein the second digital codes are based on a comparison of the analog signal with a residue signal of the first digital codes;
calculating a plurality of nonlinear calibration codes based on a plurality of relative maximums and a plurality of relative minimums of the gain calibration codes; and
removing non-linearity of the DAC based on the nonlinear calibration codes.

13. The on-line calibration method of a multi-step ADC of claim 12, wherein calculating a plurality of the nonlinear calibration codes comprises the steps of:
calculating a plurality of second code jump differences of the relative maximums and the relative minimums of the gain calibration codes;
calculating an average of the second code jump differences;
calculating a plurality of offset values, wherein each offset value is obtained by subtracting the average from the corresponding second code jump difference; and adding up each gain calibration code and the corresponding offset value to obtain the plurality of nonlinear calibration codes.

14. The on-line calibration method of a multi-step ADC of claim 12, wherein if the bit numbers of the first digital codes and the second digital codes are M and N, respectively, the numbers of the relative maximums and the relative minimums of the gain calibration codes are both $2^M-2$.

15. The on-line calibration method of a multi-step ADC of claim 12, further comprising:
obtaining the relative maximums and the relative minimums of the gain calibration codes, being comprised of the steps of:
providing a plurality of domains in order of the increment of the first digital codes;
choosing an absolute maximum and an absolute minimum of the gain calibration codes as the relative maximum and the relative minimum in the first domain and the last domain, respectively; and
choosing an absolute maximum and an absolute minimum of the gain calibration codes as the relative maximum and the relative minimum in each of the other domains.

16. The on-line calibration method of a multi-step ADC of claim 12, wherein each second code jump difference between two adjacent domains is the difference between the relative maximum of the gain calibration codes in one domain and the relative minimum of the gain calibration codes in the other domain.

17. The on-line calibration method of a multi-step ADC of claim 1, wherein the least significant bit of each first digital code and the most significant bit of the corresponding second digital code overlap.

18. A multi-step ADC, comprising:
a first ADC converting a first analog signal to a first digital code;
a DAC converting the first digital code to a second analog signal;
an analog subtractor comparing the first analog signal with the second analog signal to generate an error signal;
a residue amplifier amplifying the error signal to generate a residue signal;
a second ADC converting the residue signal to a second digital code;
a first signal processing unit receiving a plurality of first digital codes and a plurality of second digital codes to generate a gain control signal; and
a programmable gain control unit receiving the gain control signal to generate an adjustable gain signal, so as to calibrate a gain of the residue amplifier.

19. The multi-step ADC of claim 18, further comprising
a programmable reference voltage generator receiving a reference control signal from the first signal processing unit and generating a first calibration reference voltage and a second calibration reference voltage to update the voltage range of the second digital codes.

20. The multi-step ADC of claim 18, further comprising
a reference voltage generator that provides a first fixed reference voltage and a second fixed reference voltage for determining the voltage range of the first digital codes.

21. The multi-step ADC of claim 18, wherein the first signal processing unit generates a plurality of gain calibration codes based on the first digital codes and the second digital codes.

22. The multi-step ADC of claim 21, further comprising:
a second signal processing unit that receives the first digital codes and the gain calibration codes to generate a plurality of nonlinear calibration codes, so as to remove non-linearity of the DAC.

23. The multi-step ADC of claim 22, further comprising:
a third signal processing unit that receives the first digital codes and the nonlinear calibration codes to generate a digital output code.

24. The multi-step ADC of claim 23, wherein if the bit numbers of the first ADC and the DAC are M and N, respectively, the digital output code has (M+N−2) effective bits.

25. The multi-step ADC of claim 18, wherein the least significant bit of each first digital code and the most significant bit of the corresponding second digital code overlap.

* * * * *